United States Patent
Zhu et al.

(10) Patent No.: US 8,058,157 B2
(45) Date of Patent: Nov. 15, 2011

(54) FINFET STRUCTURE WITH MULTIPLY STRESSED GATE ELECTRODE

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/505,894

(22) Filed: Jul. 20, 2009

(65) Prior Publication Data

US 2009/0280626 A1    Nov. 12, 2009

Related U.S. Application Data

(62) Division of application No. 11/164,621, filed on Nov. 30, 2005, now Pat. No. 7,564,081.

(51) Int. Cl.
*H01L 29/72* (2006.01)
(52) U.S. Cl. ........ 438/517; 438/479; 438/527; 438/528; 438/530; 438/533
(58) Field of Classification Search .................. 438/479, 438/517, 527, 528, 530, 532, 533
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |

(Continued)

FOREIGN PATENT DOCUMENTS

CN    1695227 A    11/2005

(Continued)

OTHER PUBLICATIONS

Application No. 200610139559.8 Title: FinFet Structure With Multiply Stressed Gate Electrode Zhu, Huilong, et al. Notice of Rejection dated May 15, 2009.

(Continued)

*Primary Examiner* — Edward Wojciechowicz
(74) *Attorney, Agent, or Firm* — Scully, Scott, Murphy & Presser, P.C.; Joseph P. Abate, Esq.

(57) ABSTRACT

A semiconductor structure and its method of fabrication include a semiconductor fin located over a substrate. A gate electrode is located over the semiconductor fin. The gate electrode has a first stress in a first region located closer to the semiconductor fin and a second stress which is different than the first stress in a second region located further from the semiconductor fin. The semiconductor fin may also be aligned over a pedestal within the substrate. The semiconductor structure is annealed under desirable stress conditions to obtain an enhancement of semiconductor device performance.

17 Claims, 5 Drawing Sheets

U.S. PATENT DOCUMENTS

| | | | |
|---|---|---|---|
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,180,501 B1 | 1/2001 | Pey et al. |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,373,088 B2 | 4/2002 | Kwok et al. |
| 6,380,008 B2 * | 4/2002 | Kwok et al. ............ 438/158 |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,855,990 B2 | 2/2005 | Yeo et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0048861 A1 | 4/2002 | Seo |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0113174 A1 | 6/2004 | Chidambarrao et al. |
| 2004/0113217 A1 | 6/2004 | Chidambarrao et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0093074 A1 | 5/2005 | Anderson et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0022268 A1 | 2/2006 | Oh et al. |
| 2006/0027868 A1 | 2/2006 | Doris et al. |
| 2006/0057787 A1 | 3/2006 | Doris et al. |
| 2006/0060925 A1 | 3/2006 | Doris et al. |
| 2007/0048958 A1 * | 3/2007 | Liao et al. ............ 438/369 |
| 2008/0099847 A1 | 5/2008 | Tang et al. |

FOREIGN PATENT DOCUMENTS

| | | |
|---|---|---|
| JP | 6476755 | 3/1989 |

OTHER PUBLICATIONS

Rim et al., "Transductance Enhancement in Deep Submicron Strained-Si n-MOSFETs", International Electron Devices Meeting, IEEE, 1998, 26.8.1-26.8.4.

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "SiGe HBT Technology with Fmax/Ft = 350/300 GHz and Gate Delay Below 3.3 ps", IEEE, 2004.

Bean et al., "GEx Si1-x/Si Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for Si1-xGex Strained Layers on (100) Si", Appl. Phys. Lett., 1990, pp. 460-462, vol. 56, No. 29.

Ouyang et al., "Two-Dimensional Bandgap Engineering in a Novel Si/SiGe pMOSFET With Enhanced Device Performance and Scalability," IEEE, 2000, pp. 151-154.

* cited by examiner

FINFET STRUCTURE WITH MULTIPLY STRESSED GATE ELECTRODE

CROSS REFERENCE TO RELATED APPLICATION

This application is a divisional of U.S. patent application Ser. No. 11/164,621, filed Nov. 30, 2005.

DESCRIPTION

1. Field of the Invention

The invention relates generally to semiconductor structures. More particularly, the invention relates to enhanced semiconductor device performance through the use of mechanical stress effects and/or dopant redistribution effects within semiconductor structures.

2. Description of the Related Art

As semiconductor technology has advanced and semiconductor device density requirements have increased, there has been an increased need to fabricate semiconductor devices (e.g., MOSFET devices) with reduced dimensions, such as reduced gate electrode lengths of the devices. A novel semiconductor structure that accommodates increased density due to its considerably decreased dimensions is a double gate device that uses a finFET structure. A finFET structure provides a vertical channel device that includes a semiconductor fin set sideways upon a substrate. In order to obtain desirable control of short channel effects (SCEs), the semiconductor fin is thin enough in a device channel region to ensure forming fully depleted semiconductor devices. A pair of gate dielectric layers is typically located upon a pair of opposite semiconductor fin sidewalls. A gate electrode of an inverted U shape is typically located upon the semiconductor fin and covering the pair of gate dielectric layers. In some other instances, the gate electrode is not located atop the fin and thus it is restricted to the sidewalls of the fin.

Beyond finFET structures that provide space efficient transistor structures with desirable SCE control, semiconductor devices are now commonly designed to use a mechanical stress effect (MSE) and/or a dopant redistribution or mobility effect to enhance transistor performance. The MSE is generally engineered to provide enhanced charge carrier mobility within a semiconductor device. The enhanced charge carrier mobility typically leads to enhanced semiconductor device performance.

finFET structures may be fabricated with stressed components to improve performance of the finFET structures. For example, each of: (1) Rim, in U.S. Pat. No. 6,815,738; and (2) Lee et al., in Pub. No. 2004/0256647, teaches stressed semiconductor fin structures within finFETs. Each provides the stressed semiconductor fin structures by utilizing a lattice mismatch for layered components when forming the stressed semiconductor fin structures.

Since desirable SCE control and space efficiency advantages of finFET devices are likely to continue to be of considerable significance within semiconductor device technology, and since stressed structures similarly also continue to provide semiconductor devices with enhanced performance, the utilization of stressed structures within finFETs is likely to continue.

SUMMARY OF THE INVENTION

The invention provides a pair of finFET structures and a method for fabricating a finFET structure.

The first of the pair of finFET structures includes a semiconductor fin located over a substrate. The structure also includes a gate electrode located over the semiconductor fin. Within the first structure, the gate electrode has a first stress in a first region located nearer the semiconductor fin and a second stress, which is different than the first stress, in a second region located filter from the semiconductor fin.

The second of the pair of finFET structures includes a semiconductor fin located over a pedestal within a substrate. Preferably, the semiconductor fin is located aligned over the pedestal within the substrate.

The method derives from the first of the finFET structures. The method provides for forming a semiconductor fin over a substrate. It also provides for forming a gate electrode over the semiconductor fin, where the gate electrode has a first stress in a first region located nearer the semiconductor fin and a second stress, which is different than the first stress, in a second region located further from the semiconductor fin.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a finFET structure with enhanced performance, and a method for fabricating the finFET structure.

FIG. 1 to FIG. 13 show a series of schematic cross-sectional and plan-view diagrams illustrating the results of progressive stages in fabricating a finFET structure in accordance with a preferred embodiment of the invention.

Figure 1:
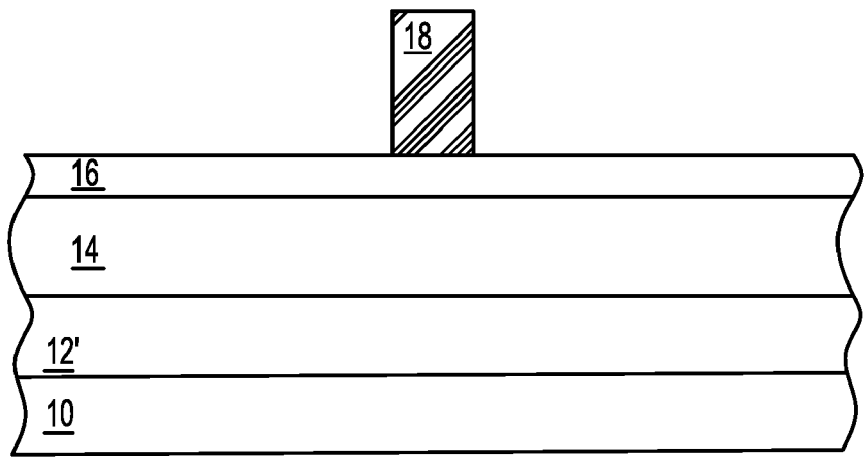
FIG. 1 to FIG. 13 show a series of schematic cross-sectional and plan-view diagrams illustrating the results of progressive stages in fabricating a finFET structure in accordance with a preferred embodiment of the invention.

Specifically, FIG. 1 shows a substrate 10 having a buried dielectric layer 12 located thereupon. A semiconductor layer 14 is located upon the buried dielectric layer 12. A hard mask layer 16 is located upon the semiconductor layer 14. Finally, a patterned photoresist layer 18 is located upon the hard mask layer 18.

The substrate 10 may comprise any of several materials, including but not limited to: a conductor material, a semiconductor material or a dielectric material. Typically, the substrate 10 comprises a semiconductor material. The semiconductor material may be selected from the group including, but not limited to: silicon (Si), germanium (Ge), silicon-germanium (SiGe) alloy, silicon carbide (SiC), silicon-germanium alloy carbide (SiGeC) and compound semiconductor materials, such as (III-VI) and (II-VI) semiconductor materials. Non-limiting examples of compound semiconductor materials include gallium arsenide, indium arsenide and indium phosphide materials. Typically, the substrate 10 has a thickness from about 1 to about 3 mils.

The buried dielectric layer 12 typically comprises an oxide of a semiconductor material from which comprises the substrate 10, when the substrate 10 comprises a semiconductor material. Alternatively, the buried dielectric layer 12 may comprise a nitride, an oxynitride or an alternative dielectric material. The buried dielectric layer 12 may be formed utilizing methods as are conventional in the semiconductor fabrication art. Non-limiting examples of the methods include thermal annealing methods, chemical vapor deposition methods and physical vapor deposition methods. Typically, the buried dielectric layer 12 has a thickness from about 200 to about 10000 angstroms.

The semiconductor layer 14 may comprise any of several semiconductor materials as are also conventional in the art. The semiconductor materials may include, but are not limited to: silicon, germanium, silicon-germanium alloy, silicon carbide, silicon-germanium alloy carbide, GaAs, InAs, InP, as well as other compound (III-V) and (II-VI) semiconductor materials. The semiconductor layer 14 may also comprise an organic semiconductor material. Typically, the semiconductor layer 14 has a thickness from about 300 to about 1000 angstroms.

The substrate 10 (when comprising a semiconductor material), the buried dielectric layer 12 and the semiconductor layer 14 comprise in an aggregate a semiconductor-on-insulator substrate. Within the embodiment and the invention, the substrate 10 typically comprises a silicon or silicon-germanium alloy semiconductor material, the buried dielectric layer 12 typically comprises a corresponding silicon or silicon-germanium oxide material and the semiconductor layer 14 typically also comprises a corresponding silicon or silicon-germanium alloy semiconductor material. The semiconductor-on-insulator substrate may be formed utilizing any of several methods that are conventional in the semiconductor fabrication art. Non-limiting examples of such methods include layer transfer methods, laminating methods and, in particular, separation by implantation of oxygen (SIMOX) methods.

The hard mask layer 16 comprises a hard mask material as is otherwise generally conventional in the art. Non-limiting examples of hard mask materials include oxides, nitrides and oxynitrides, typically of silicon and/or germanium, but oxides, nitrides and oxynitrides of other elements may also be utilized. The aforementioned hard mask materials may be deposited utilizing methods including, but not limited to: thermal annealing methods, chemical vapor deposition methods and physical vapor deposition sputtering methods. Typically, the hard mask layer 16 has a thickness from about 200 to about 400 angstroms, although such a thickness does not limit the embodiment or the invention.

The patterned photoresist layer 18 may comprise photoresist materials that are conventional in the art. Non-limiting examples include positive photoresist materials, negative photoresist materials and hybrid photoresist materials. The resists may be processed to provide the patterned photoresist layer 18 utilizing spin coating, photoexposure and development methods and materials as are conventional in the art. Typically, the patterned photoresist layer 18 has a thickness from about 5000 to about 15000 angstroms.

Figure 2:
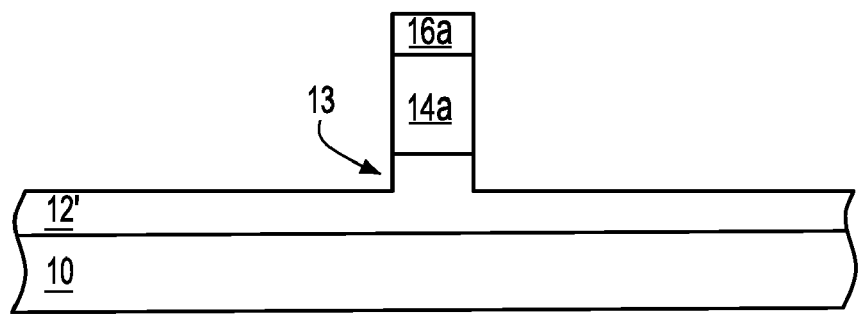

FIG. 2 shows the results of sequentially etching the hard mask layer 16, the semiconductor layer 14 and, in part, the buried dielectric layer 12 to yield a corresponding patterned hard mask layer 16*a* located aligned upon a semiconductor fin 14*a* in turn located aligned upon a pedestal 13 within an etched buried dielectric layer 12'. Typically, the pedestal 13 has a height from about 200 to about 400 angstroms within the etched buried dielectric layer 12'. The foregoing etching of at least the hard mask layer 16 to form the patterned hard mask layer 16*a* is effected while utilizing the patterned photoresist layer 18 as an etch mask. The patterned hard mask layer 16*a*, with or without the patterned photoresist layer 18*a*, is utilized when patterning the semiconductor fin 14*a* from the semiconductor layer 14 and typically also when etching the buried dielectric layer 12 to form the etched buried dielectric layer 12'.

The foregoing layers are preferably etched anisotropically to thus provide substantially straight sidewalls. Such etching typically utilizes a reactive ion etch plasma etchant or another anisotropic etchant, such as an ion beam etchant. Wet chemical etchant materials, while typically less common, may under certain circumstances also be utilized, although they are generally isotropic etchants. When utilizing a reactive ion etch plasma etchant, a fluorine containing etchant gas composition is typically utilized when etching a silicon containing hard mask material or a silicon containing dielectric material. A chlorine containing etchant gas composition is typically utilized when etching a silicon or germanium containing semiconductor material.

Figure 3:
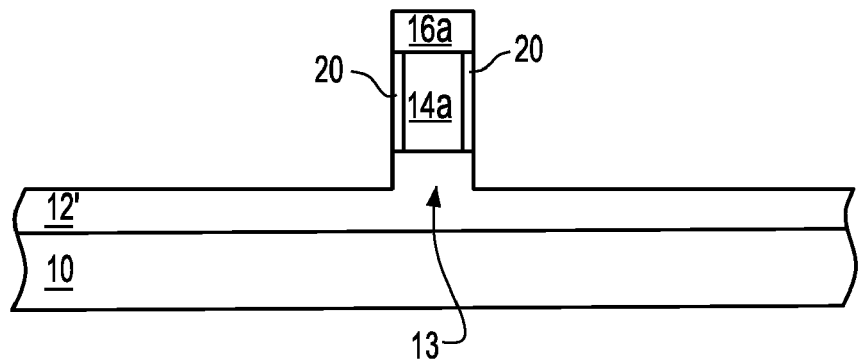

FIG. 3 shows a pair of gate dielectric layers 20 located upon a pair of opposite sidewalls of the semiconductor fin 14*a*. The pair of gate dielectric layers 20 typically comprises a thermal oxide of a semiconductor material which comprises the semiconductor fin 14*a*. When thermal techniques are used, the gate dielectric layers 20 are formed within a surface portion of the semiconductor fin 14*a*, as shown. Alternatively, deposited dielectric materials rather than thermally grown dielectric materials may also be utilized. When deposited dielectrics are used, the gate dielectric would generally be present on the sidewalls and over a top portion of the semiconductor fin 14*a*. Such alternative deposited dielectric materials may include, but are not limited to: other silicon oxides, nitrides and oxynitrides that typically have a dielectric constant from about 4 to about 20 as measured in vacuum; as well as heavier metal oxides such as hafnium oxides, hafnium silicates, aluminum oxides, titanium oxides, lanthanum oxides, barium-strontium-titanate (BST), lead-zirconate-titanate (PZT) and other ferroelectric materials. The heavier metal oxides typically have a dielectric constant greater than about 20 and perhaps as high as at least 100. Typically, each of the pair of gate dielectric layers 20 has a thickness from about 10 to about 20 angstroms when comprised of a thermal silicon oxide material.

Figure 4:
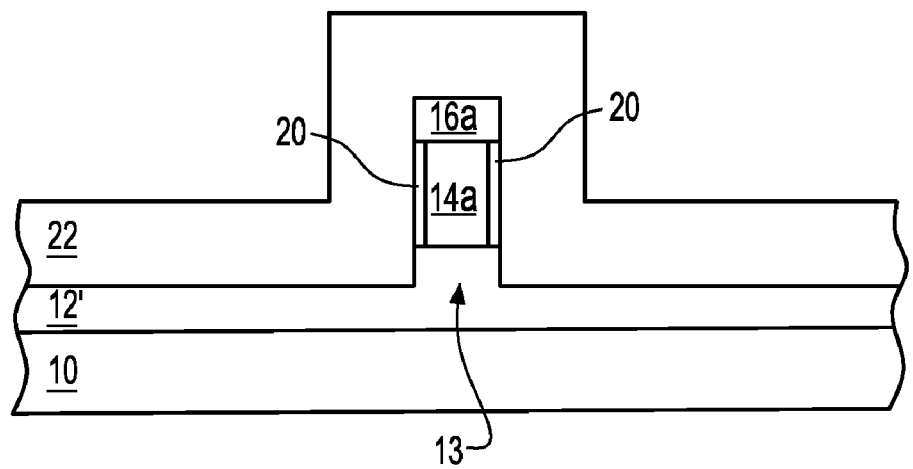

FIG. 4 shows a gate electrode 22 of inverted U shape located over the semiconductor fin 14*a* and upon the etched buried dielectric layer 12', the pair of gate dielectric layers 20 and the patterned hard mask layer 16*a*. The gate electrode 22 typically comprises a doped polysilicon material (i.e., dopant concentration from about 1e18 to 1e20 dopant atoms per cubic centimeter). Alternative gate electrode conductor materials may be utilized provided that they are in a nominally crystalline or otherwise ordered state that is susceptible to decrystallization or amorphization or other processing to provide a depth specific amorphous or otherwise non-crystalline region. Such other conductor materials may thus include, but are not limited to: certain metals, metal alloys, metal nitrides and metal silicides. The gate electrode 22 may be formed utilizing deposition and patterning methods as are otherwise generally conventional in the art. Non-limiting examples include chemical vapor deposition methods and physical vapor deposition methods. Typically, the gate electrode 22 has a thickness from about 800 to about 1500 angstroms.

Figure 5:
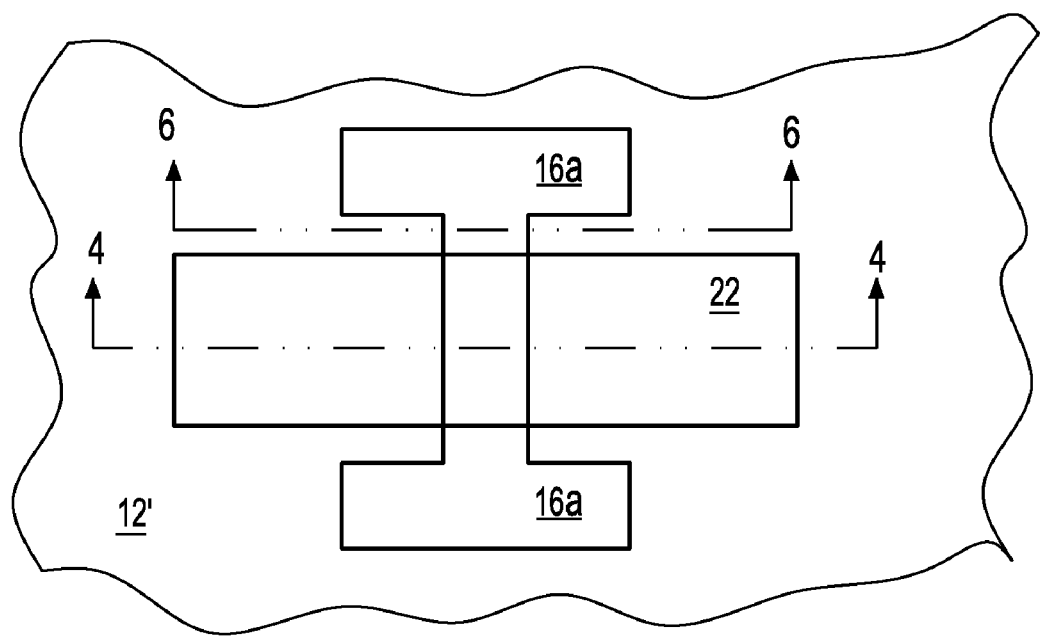

FIG. 5 shows a schematic plan-view diagram of a semiconductor structure corresponding with the semiconductor structure of FIG. 4.

FIG. 5 shows the etched buried dielectric layer 12'. The patterned hard mask layer 16*a* in a dogbone shape is located over the etched buried dielectric layer 12'. Aligned beneath the patterned hard mask layer 16*a* is the semiconductor fin 14*a* and the pair of gate dielectric layers 20. Elements 14*a* and 20 are not specifically illustrated in FIG. 5. The gate electrode 22 traverses the semiconductor fin 14a and the overlying patterned hard mask layer 16a at the center thereof. The portion of the semiconductor fin 14a covered by the gate electrode 22 comprises a channel region. The end portions of the semiconductor fin 14a uncovered by the gate electrode 22 comprises a region where a pair of source/drain regions can subsequently be located and formed. The dogbone shape of both the patterned hard mask layer 16a and the semiconductor fin 14a aligned there beneath is intended to have a central axial portion that extends to a pair of lobed ends of line width greater than the central axial portion. The central axial portion may have a line width from about 0.05 to about 0.30 microns, although neither the embodiment nor the invention is so limited to such a line width range. FIG. 5 illustrates the lobed ends of the patterned hard mask layer 16a dogbone as particularly angular, but in a discrete finFET structure as illustrated in FIG. 5 lobed ends may alternatively have less angular features.

Similarly, while the schematic plan-view diagram of FIG. 5 illustrates a finFET in accordance with the instant embodiment as a discrete device having a single semiconductor fin and gate electrode, such a particular structure does not limit the embodiment or the invention. Rather, embodiments are also contemplated where multiple finFET devices may be linked with a single elongated spanning gate electrode (such as gate electrode 22) in one or both directions. Also, multiple devices may be linked through alternatively spanning semiconductor fins (such as semiconductor fin 14a) in one or both directions.

Figure 6:
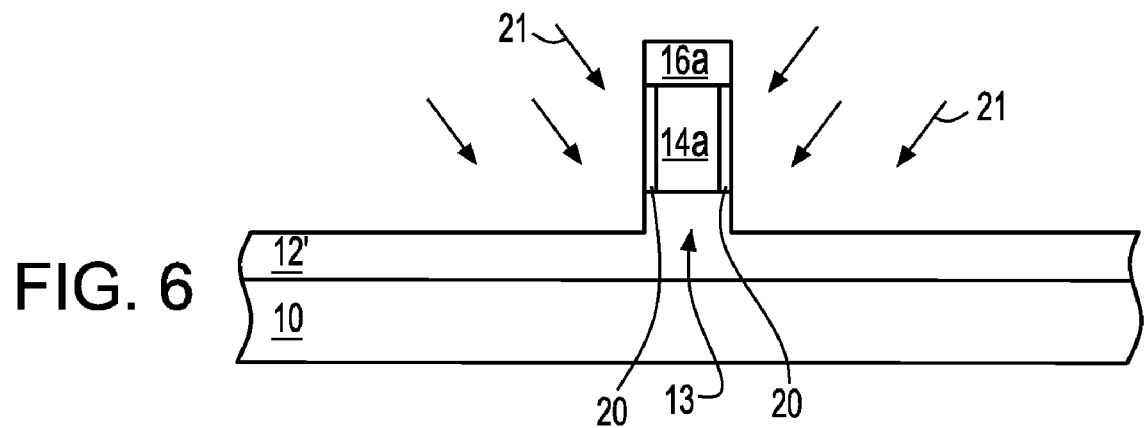

FIG. 6 shows a schematic cross-sectional diagram through a source/drain extension region of the semiconductor fin 14a in accordance with the cross-sectional reference plane 6-6 illustrated in FIG. 5.

FIG. 6 shows the semiconductor fin 14a located upon the pedestal 13 within the etched buried dielectric layer 12'. FIG. 6 also shows the pair of gate dielectric layers 20 located upon opposite sidewalls of the semiconductor fin 14a, and the patterned hard mask layer 16a located atop the semiconductor fin 14a. Finally, FIG. 6 shows a dose of first implanting ions 21 that is used for forming an extension implant and/or a halo implant located within the extension region. The dose of first implanting ions 21 is provided at a tilt angle typically from about 30° to about 45° with respect to the major plane of the etched buried dielectric layer 12', and also at a concentration conventional in the finFET fabrication art. The dose of first implanting ions 21 also has a polarity appropriate to the polarity of the finFET desired to be fabricated.

Figure 7:
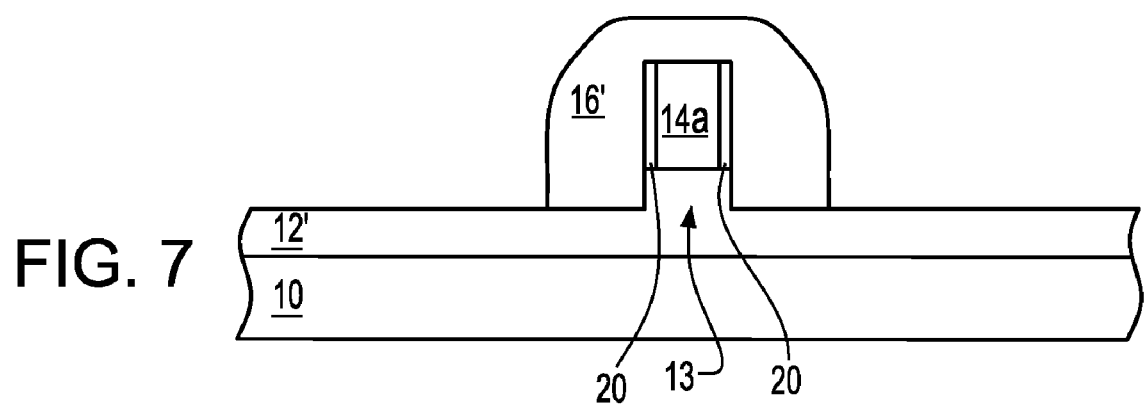

FIG. 7 shows a schematic cross-sectional diagram illustrating the results of further processing of the finFET whose schematic cross-sectional diagram is illustrated in FIG. 6.

FIG. 7 shows a contiguous spacer layer 16' that covers the sidewalls of the pair of gate dielectric layers 20 and incorporates the patterned hard mask layer 16a as illustrated in FIG. 6. Typically, the contiguous spacer layer 16' comprises a spacer material analogous, equivalent or identical to the hard mask material from which is comprised the patterned hard mask layer 16a. Typical non-limiting materials include oxides, nitrides and oxynitrides. Typically, the contiguous spacer layer 16' is formed using a blanket layer (i.e., from about 300 to about 500 angstrom thickness) deposition step, followed by an anisotropic etchback step. Chemical vapor deposition methods (thermally activated and plasma activated) and physical deposition methods may be used for the blanket layer deposition. Other methods are not precluded.

The contiguous spacer layer 16' as illustrated in FIG. 7 inhibits undesirable ion implant damage to the source/drain and extension regions within the semiconductor fin layer 14a incident to further amorphizing ion implant processing of the semiconductor structure whose schematic cross-sectional diagram is illustrated in FIG. 4. Thus, both the extension and halo ion implant processing as illustrated in FIG. 6 and the contiguous spacer layer processing as illustrated in FIG. 7 are typically effected prior to additional amorphizing ion implant processing of the semiconductor structure of FIG. 4, in accordance with the embodiment and the invention.

Figure 8:
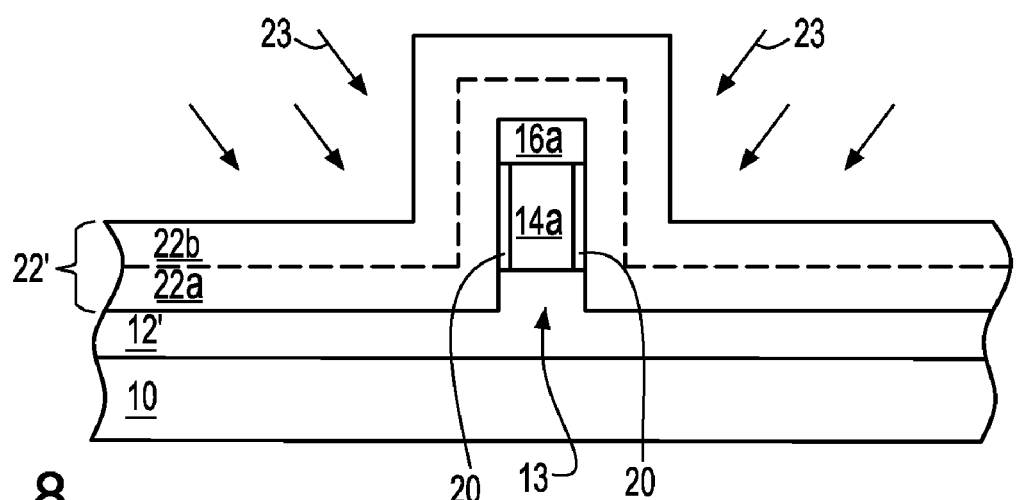

FIG. 8 shows the results of such additional amorphizing ion implant processing of the semiconductor structure of FIG. 4 as viewed through the cross-section reference plane 4-4 illustrated in FIG. 5. Again, the additional amorphizing ion implant processing is typically effected after the processing illustrated in FIG. 6 and FIG. 7.

FIG. 8 shows the results of ion implanting the gate electrode 22 to form a partially amorphized gate electrode 22'. The partially amorphized gate electrode 22' comprises an unamorphized sub-layer 22a located nearer the semiconductor fin 14a. The partially amorphized gate electrode 22' also comprises an amorphized sub-layer 22b as a surface layer located further from the semiconductor fin 14a. The partially amorphized gate electrode 22' is amorphized to a distance that corresponds with the thickness of the amorphized sub-layer 22b. Thus, the amorphized sub-layer 23b and the unamorphized sub-layer 23a are inherently intended as, and illustrated as, conformal sub-layers. The distance is preferably deeper than an interface of the semiconductor fin 14a with the etched buried dielectric layer 12' Amorphization is effected utilizing a dose of amorphizing ions 23. The dose of amorphizing ions 23 is preferably of a variety that also includes dopant ions insofar as the amorphizing ions may also be utilized for doping certain portions of the source/drain regions within the semiconductor fin 14a that are not covered by the partially amorphized gate electrode 22' as illustrated in FIG. 8, or thicker portions of the contiguous spacer layer 16' as illustrated in FIG. 7. The amorphizing ions 23 may similarly also include non-dopant amophizing ions such as germanium amorphizing ions. Other heavier non-amorphizing ions may also be used. Typically, an aggregate concentration of amorphizing ions 23, including dopant and non-dopant amorphizing ions, is from about 1e18 to about 1e22 dopant atoms per cubic centimeter. The amorphizing ions 23 are preferably provided at a tilt angle of from about 30° to about 45° as illustrated in FIG. 6, although this is not required in either the instant embodiment or in the invention. As is understood by a person skilled in the art, the foregoing process conditions provide an amorphizing atom concentration of 1e18 to about 1e22 greater in the amorphized sub-layer 22b (i.e., a region that is further from the semiconductor fin 14a) in comparison with the unamorphized sub-layer 22a (i.e., a region that is closer to the semiconductor fin 14a).

Figure 9:
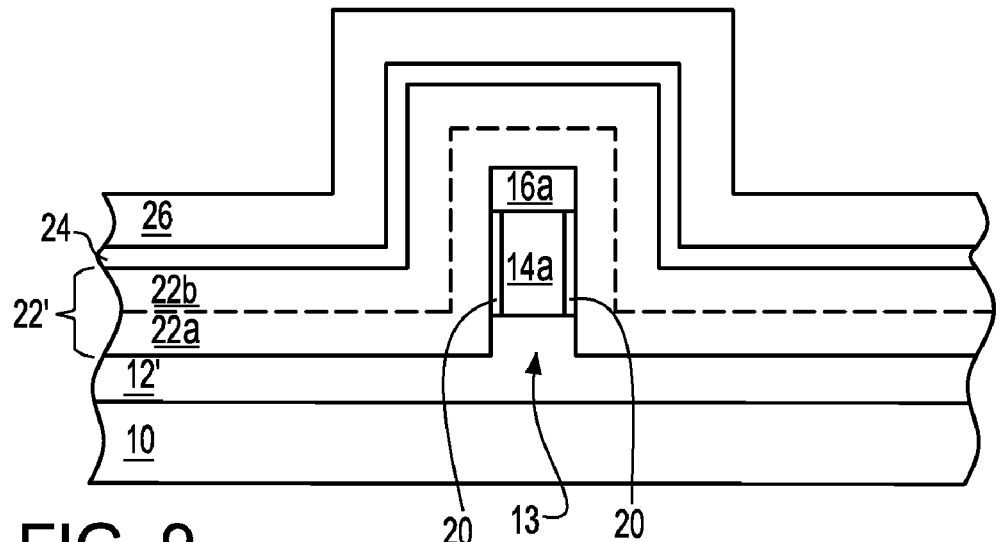

FIG. 9 shows a pad dielectric layer 24 located upon the partially amorphized gate electrode 22', and also a stress imparting layer 26 located upon the pad dielectric layer 24.

The pad dielectric layer 24 typically comprises any of several dielectric materials as are conventionally utilized for a pad dielectric layer. Non-limiting examples include silicon oxide, silicon nitride and silicon oxynitride materials. Silicon oxide materials are particularly common. The pad dielectric layer 24 may be formed utilizing any of several methods as are convention in the art. Non-limiting examples include thermal oxidation methods, chemical vapor deposition methods and physical vapor deposition methods. Preferably, the pad dielectric layer 24 is formed utilizing a thermal oxidation method to yield a silicon oxide material. Typically, the pad dielectric layer 24 has a thickness from about 10 to about 100 angstroms.

The stress imparting layer 26 may comprise any of several stress imparting materials, but from a practical perspective the stress imparting material must have thermal resistance characteristics that allow for higher temperature annealing absent deterioration of the stress imparting layer or any layers there beneath. Non-limiting examples of stress imparting materials include silicon nitride materials and silicon oxynitride materials. Silicon nitride materials are particularly preferred. The stress imparting layer 26 may have either a positive stress or a negative stress as appropriate for either an n-finFET or a p-finFET.

Also from a practical perspective, there are several process variables that may be utilized to influence stress when forming the stress imparting layer 26. Non-limiting examples include deposition temperature, starting materials, deposition rate and thickness. Typically, the stress imparting layer has a thickness from about 500 to about 2000 angstroms, although neither the embodiment nor the invention is so limited.

Figure 10:
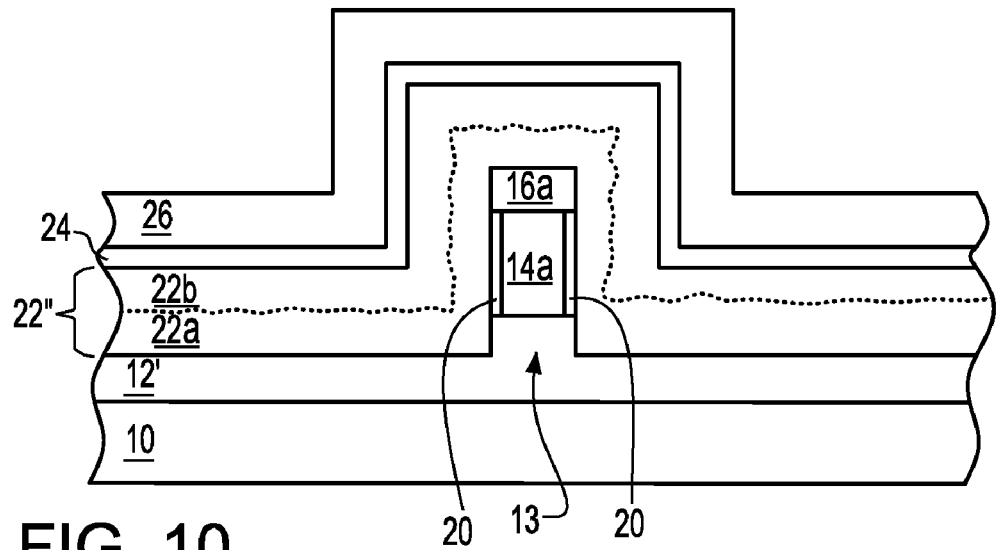

FIG. 10 shows the results of thermally annealing the semiconductor structure of FIG. 9. Incident to the thermal annealing, the partially amorphized gate electrode 22' recrystallizes to yield a recrystallized gate electrode 22". Within the context of the instant embodiment, recrystallization of the partially amorphized gate electrode 22' to yield the recrystallized gate electrode 22" coincidentally involves recrystallization of the amorphized sub-layer 22b to provide a recrystallized sub-layer 22b'. When the partially amorphized gate electrode 22' recrystallizes to yield the recrystallized gate electrode 22", it does so (i.e., in particular with respect to the amorphized sub-layer 222b) under the influence of the stress condition of the stress imparting layer 26. Thus, the recrystallized gate electrode 22" has a first stress in a first portion or region located nearer the semiconductor fin 14a and the etched buried dielectric layer 12' (i.e., the unamorphized sub-layer 22a which is formed with an initial stress level) and a second stress different than the first stress in a separate second portion or region further from the semiconductor fin 14a and the etched buried dielectric layer 12' (i.e., the recrystallized sub-layer 22b'). Moreover, during the recrystallization and its attendant thermal annealing, dopants contained in the partially amorphized gate electrode 22' and the semiconductor fin 14a will redistribute within the context of the stress imparted from stress imparting layer 26 into the amorphized sub-layer 22b. This type and mechanism of dopant redistribution can also enhance finFET device performance.

With respect to the recrystallized gate electrode 22', the first stress therein may be less than the second stress or the first stress may be greater than the second stress. The first stress and the second stress may be both compressive or both tensile. Alternatively, one of the first stress and the second stress may be tensile and the other of the first stress and the second stress may be compressive.

Recrystallization of the partially amorphized gate electrode 22' to form the recrystallized gate electrode 22" may be undertaken utilizing any of several thermal annealing methods that are conventional in the semiconductor fabrication art. Non-limiting examples include furnace annealing methods and rapid thermal annealing methods. Typically, but not exclusively, the partially amorphized gate electrode 22' is thermally annealed at a temperature from about 1000° to about 1200° C. for a time period from about 2 to about 6 hours. Typically, the thermal annealing is undertaken in an inert atmosphere, such as a helium, argon, krypton or nitrogen atmosphere, although this is not required. As is understood by a person skilled in the art, the foregoing thermal annealing conditions also provide for a recrystallizing of source/drain regions of the semiconductor fin 14a and a drive-in of active dopants implanted therein.

Figure 11:
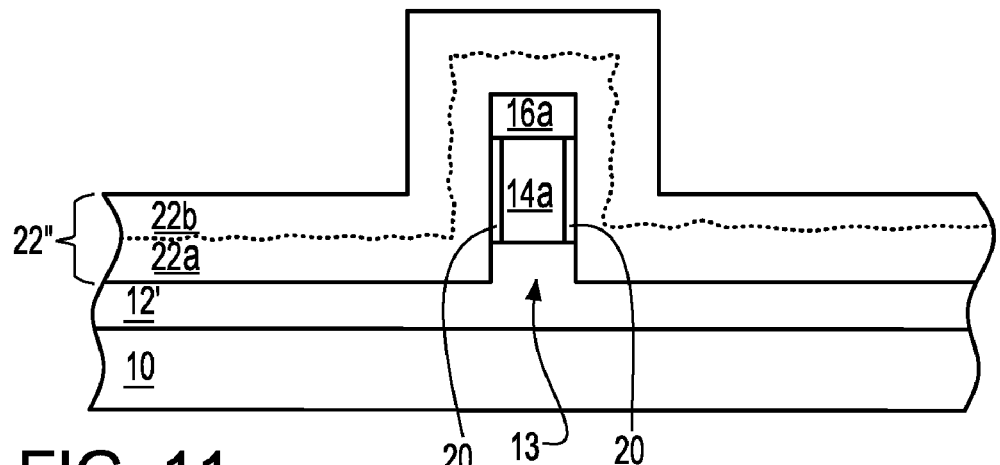

FIG. 11 shows the results of sequentially stripping the stress imparting layer 26 and the pad dielectric layer 24 from the semiconductor structure of FIG. 10. Upon stripping, they leave exposed the recrystallized gate electrode 22". They may be sequentially stripped while utilizing methods and materials that are conventional in the semiconductor fabrication art. In particular, but without limitation, for silicon nitride or silicon oxynitride materials aqueous phosphoric acid materials may be utilized. Also without limitation, for silicon oxide materials aqueous hydrofluoric acid materials may be utilized. Other appropriate wet chemical etch materials and dry plasma etch materials may also be utilized.

FIG. 11 shows in a first instance a semiconductor structure in accordance with a preferred embodiment of the invention. In a first instance, the semiconductor structure comprises a semiconductor fin 14a aligned upon a pedestal 13 within an etched buried dielectric layer 12'. The pedestal 13 spaces the semiconductor fin 14a above surrounding portions of the etched buried dielectric layer 12'. Due to the spacing the recrystallized gate electrode 22" subsequently located and formed upon the semiconductor fin 14a is so located with a more complete overlap. Within the finFET structure in accordance with FIG. 11 the recrystallized gate electrode 22" has multiple regions with different stress. The multiple regions include a first region located closer the semiconductor fin 14a and having a first stress, as well as a second region located further from the semiconductor fin 14a and having a second stress different than the first stress.

Although the preferred embodiment illustrates the invention with the recrystallized gate electrode 22" having two regions of different stress, neither the instant embodiment nor the invention is so limited. Rather, as is understood by a person skilled in the art the invention may be practiced with sequentially less and less deep ion implant amorphizations of a gate electrode, along with concurrent and sequential recrystallizations under multiple sequential stress imparting layer influence. The foregoing process sequence yields further additionally defined stress regions within a multiply recrystallized gate electrode.

Figure 12:
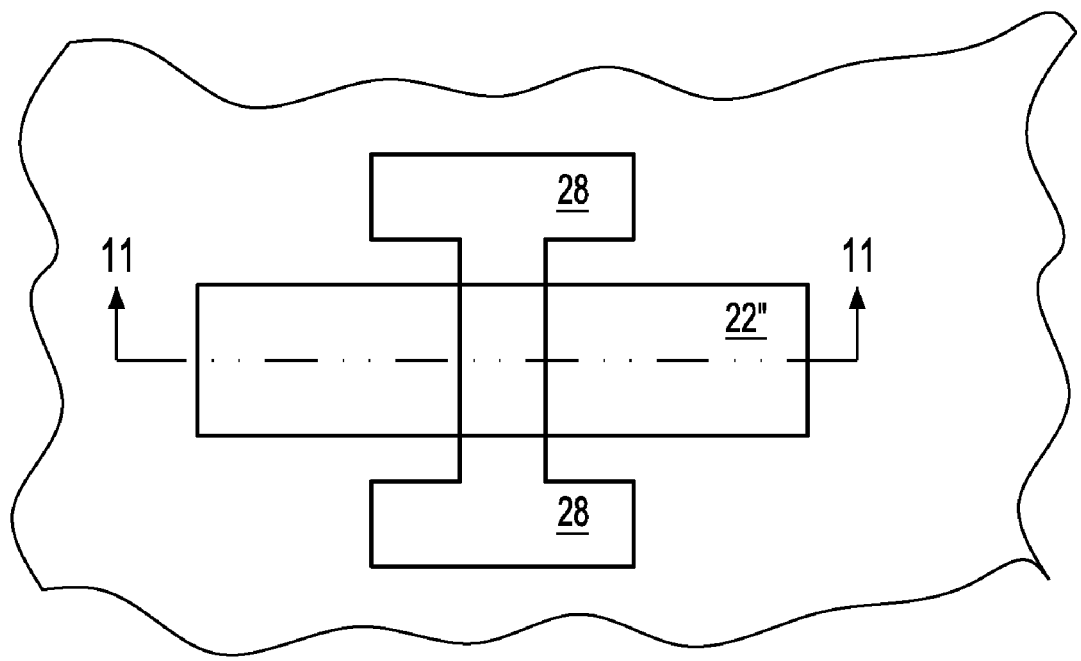

FIG. 12 shows a schematic plan-view diagram illustrating the results of further processing of the finFET of FIG. 11. FIG. 12 also corresponds with FIG. 5, but with a pair of silicide layers 28 located upon source/drain regions of the semiconductor fin layer 14a not covered by the recrystallized gate electrode 22". To provide the finFET structure of FIG. 12 in comparison with the finFET structure of FIG. 5, portions of the patterned hard mask layer 16a located upon regions of the semiconductor fin 14a not covered by the recrystallized gate electrode 22" are removed. They may be removed utilizing etch methods as are conventional in the semiconductor fabrication art. The methods may include, but are not limited to: wet chemical etch methods and dry plasma etch methods.

Once source/drain region portions of the semiconductor fin 14a are exposed, the pair of silicide layers 28 may be formed utilizing methods as are also conventional in the art. Typically, the pair of silicide layers 28 is formed utilizing a metal silicide forming metal layer deposition, thermal annealing and subsequent unreacted metal etch method (i.e. a salicide method). Alternative methods may be employed. Typical metal silicide forming metals include, but are not limited to: tungsten, cobalt, platinum, nickel and titanium. Thermal annealing conditions are typically about 350° to about 850° C. for a time period from about 1 second to about 10 minutes.

Unreacted metal etchants are specific to particular metals and are typically wet chemical etchants, although this is not a requirement of the invention. Typically, each of the pair of silicide layers 28 has a thickness from about 50 to about 300 angstroms. They are optional within the invention.

Figure 13:
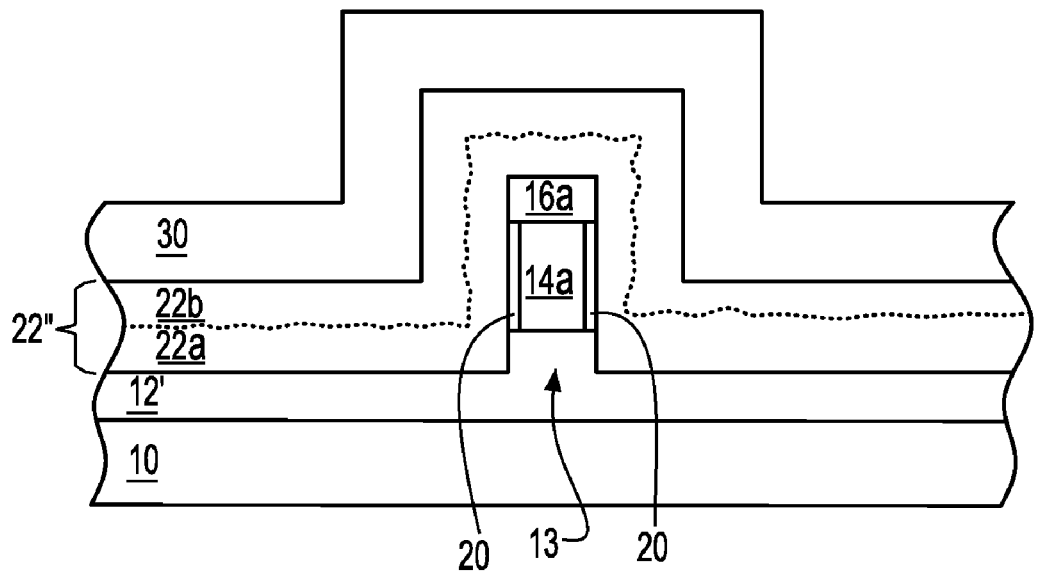

FIG. 13 shows the results of further processing of the semiconductor structure of FIG. 11 or FIG. 12, since the pair of silicide layers 28 as illustrated in FIG. 12 is optional in the invention. FIG. 13 shows a second stress imparting layer 30 located upon the recrystallized gate electrode 22". The second stress imparting layer 30 may comprise stress imparting materials analogous, equivalent or identical to those utilized for the stress imparting layer 26. It may also be formed utilizing methods that are analogous, equivalent or identical. The second stress imparting layer 30 typically has a thickness from about 200 to about 1000 angstroms.

Within the instant embodiment, the second stress imparting layer 30 may have a third stress different from either: (1) the first stress closer to the semiconductor fin 14a within the unamorphized sub-layer 22a of the recrystallized gate electrode 22"; or (2) the second stress further from the semiconductor fin 14a within the recrystallized sub-layer 22b' of the recrystallized gate electrode 22". The first stress, the second stress and the third stress may define a continuous stress progression (either increasing or decreasing). Alternatively, they may define a discontinuous stress progression. Each of the first stress, second stress and third stress may independently be a tensile stress or a compressive stress. Magnitudes of the first stress, second stress and third stress may also vary, but will typically range from about −3.5 GPa to 2.5 GPa.

FIG. 13 shows a semiconductor structure further in accordance with a preferred embodiment of the invention. The semiconductor structure includes a finFET structure that comprises the recrystallized gate electrode 22", having a first stress in a first region (i.e., unamorphized sub-layer 22a) located closer to the semiconductor fin 14a therein and a second stress different than the first stress in a second region (i.e., recrystallized sub-layer 22b') located further from the semiconductor fin 14a. The finFET structure also comprises the stress imparting layer 30 located over the recrystallized gate electrode 22". The stress imparting layer 30 may have a third stress different from either the first stress or the second stress. The differing stress levels within multiple portions of the recrystallized gate electrode 22" within the finFET in accordance with the embodiment provides for assistance in tuning stress within the semiconductor fin 14a within the finFET. In turn, this may provide for enhanced finFET performance.

The preferred embodiment of the invention is illustrative of the invention rather than limiting of the invention. Revisions and modifications may be made to methods, materials, structures and dimensions in accordance with the preferred embodiment of the invention while still providing an embodiment in accordance with the invention, further in accordance with the accompanying claims.

What is claimed is:

1. A method for fabricating a structure comprising:
   forming a semiconductor fin over a substrate; and
   forming a gate electrode over the semiconductor fin, the gate electrode having a first stress in a first region located nearer the semiconductor fin and a second stress which is different than the first stress in a second region located further from the semiconductor fin, wherein said forming the gate electrode comprises providing a patterned gate electrode conductor material over said semiconductor fin, ion implanting into said patterned gate electrode conductor material to form a partially amorphized gate electrode comprising an unamorphized sub-layer located nearer the semiconductor fin and an amorphized sub-layer located further from the semiconductor fin, forming a stress imparting layer atop the partially amorphized gate electrode, performing a thermal annealing, said thermal annealing recrystallizes said amorphized sub-layer, while introducing stress to the recrystallized sub-layer forming the second region of the gate electrode, and removing the stress imparting layer, and wherein said unamorphized sub-layer provides said first region of the gate electrode.

2. The method of claim 1 wherein the substrate is a semiconductor-on-insulator substrate.

3. The method of claim 1 wherein the semiconductor fin comprises a semiconductor material selected from the group consisting of Si, SiC, SiGe, SiGeC, Ge, GaAs, InAs, InP, other III-V or II-VI compound semiconductor materials and organic semiconductor materials.

4. The method of claim 1 wherein the first stress and the second stress provide a gradient of stress.

5. The method of claim 1 wherein the first stress and the second stress are of opposite type.

6. The method of claim 1 wherein the semiconductor fin is formed over a raised portion of the substrate.

7. The method of claim 1 wherein the semiconductor fin is formed aligned over a raised portion of the substrate.

8. The method of claim 1 wherein said ion implanting comprises a dose of an amorphizing ion.

9. The method of claim 8 wherein said amorphizing ion comprises Ge.

10. The method of claim 8 wherein said dose is from 1e18 to 1e22 atoms per cubic centimeter.

11. The method of claim 8 wherein said ion implanting is performed at an angle from 30° to 45° relative to an upper horizontal surface of the substrate.

12. The method of claim 1 further comprising forming a pad dielectric layer between the partially amorphized gate electrode and the stress inducing layer.

13. The method of claim 1 wherein said thermal annealing is performed at a temperature from 1000° C. to 1200° C.

14. The method of claim 10 wherein said thermal annealing is performed for a time period of from 2 to 6 hours.

15. The method of claim 1 wherein said removing the stress inducing layer comprises etching in aqueous phosphoric acid.

16. The method of claim 1 wherein said removing the stress inducing layer comprises etching in aqueous hydrofluoric acid.

17. The method of claim 1 further comprising a patterned hard mask on an upper surface of the semiconductor fin, said patterned hard mask separates a portion of the gate electrode over said semiconductor fin from said semiconductor fin.

\* \* \* \* \*